(12) United States Patent
Zhang et al.

(10) Patent No.: US 12,148,744 B2
(45) Date of Patent: Nov. 19, 2024

(54) OPTICAL MULTICHIP PACKAGE WITH MULTIPLE SYSTEM-ON-CHIP DIES

(71) Applicant: Intel Corporation, Santa Clara, CA (US)

(72) Inventors: Zhichao Zhang, Chandler, AZ (US); Kemal Aygün, Tempe, AZ (US); Suresh V. Pothukuchi, Chandler, AZ (US); Xiaoqian Li, Chandler, AZ (US); Omkar Karhade, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 816 days.

(21) Appl. No.: 17/132,976

(22) Filed: Dec. 23, 2020

(65) Prior Publication Data

US 2022/0199600 A1   Jun. 23, 2022

(51) Int. Cl.
| | | |
|---|---|---|
| H04B 10/00 | (2013.01) | |
| G02B 6/42 | (2006.01) | |
| H01L 25/00 | (2006.01) | |
| H01L 25/18 | (2023.01) | |
| H01L 23/373 | (2006.01) | |
| H01L 23/538 | (2006.01) | |

(52) U.S. Cl.
CPC ............ H01L 25/18 (2013.01); G02B 6/4268 (2013.01); G02B 6/428 (2013.01); H01L 25/50 (2013.01); H01L 23/3736 (2013.01); H01L 23/538 (2013.01)

(58) Field of Classification Search
CPC ..... H01L 25/18; H01L 25/50; H01L 23/3736; H01L 23/538; H01L 25/167; G02B 6/4268; G02B 6/428
See application file for complete search history.

(56) References Cited

U.S. PATENT DOCUMENTS

| | | | |
|---|---|---|---|
| 10,230,476 B1* | 3/2019 | Akhter | ................ H04B 10/801 |
| 10,866,376 B1 | 12/2020 | Ghiasi | |
| 11,171,075 B2* | 11/2021 | Liu | ........................ H01L 24/80 |
| 11,521,914 B2* | 12/2022 | Wan | ...................... H01L 23/473 |
| 11,550,099 B2* | 1/2023 | Charles | ................. H01S 5/1032 |
| 2008/0107373 A1* | 5/2008 | Lee | ........................... G02B 6/43 |
| | | | 257/E31.109 |

(Continued)

FOREIGN PATENT DOCUMENTS

CN   111929780   11/2020

OTHER PUBLICATIONS

International Search Report for International Patent Application No. PCT/US2021/051137 mailed Jan. 7, 2022, 9 pages.

(Continued)

*Primary Examiner* — Agustin Bello

(74) *Attorney, Agent, or Firm* — Schwabe, Williamson & Wyatt P.C.

(57) ABSTRACT

Embodiments described herein may be related to apparatuses, processes, and techniques related to disaggregating co-packaged SOC and photonic integrated circuits on an multichip package. The photonic integrated circuits may also be silicon photonics engines. In embodiments, multiple SOCs and photonic integrated circuits may be electrically coupled, respectively, into modules, with multiple modules then incorporated into an MCP using a stacked die structure. Other embodiments may be described and/or claimed.

17 Claims, 10 Drawing Sheets

(56) References Cited

U.S. PATENT DOCUMENTS

| | | | |
|---|---|---|---|
| 2017/0194308 A1 | 7/2017 | Evans et al. | |
| 2018/0005991 A1* | 1/2018 | Seidemann | H01L 24/96 |
| 2018/0299628 A1 | 10/2018 | Liu et al. | |
| 2019/0324223 A1* | 10/2019 | Yim | H04B 10/60 |
| 2020/0013699 A1* | 1/2020 | Liu | H01L 24/80 |
| 2020/0158957 A1* | 5/2020 | Hsieh | G02B 6/35 |
| 2020/0284981 A1 | 9/2020 | Harris et al. | |
| 2021/0366802 A1* | 11/2021 | Huang | H01L 25/167 |
| 2022/0196942 A1* | 6/2022 | Pratap | G02B 6/423 |
| 2022/0199600 A1* | 6/2022 | Zhang | G02B 6/4268 |
| 2023/0080454 A1* | 3/2023 | Pietambaram | H01L 23/49805 |
| | | | 385/14 |

OTHER PUBLICATIONS

Search Report for Netherlands Application No. 2029702 mailed Feb. 28, 2023, 10 pgs., partial English translation.
Ward A et al: "Development of a heat spreader for high power electronic modules using thermal vias", Thermal and Thermomechanical Phenomena in Electronic Systems, 1998. IT HERM '98. The Sixth Intersociety Conference in Seattle, Wa, USA May 27-30, 1998, New York, NY, USA, IEEE, US, May 27, 1998 (May 27, 1998), bladzijden 520-523, XP010292631, DOI: 10.1109/ITHERM. 1998.689614 ISBN: 978-0-7803-4475-4.

* cited by examiner

OPTICAL MULTICHIP PACKAGE WITH MULTIPLE SYSTEM-ON-CHIP DIES

FIELD

Embodiments of the present disclosure generally relate to the field of semiconductor packaging, and in particular to optical multichip packages that include multiple system on-chip (SOC) dies.

BACKGROUND

Continued growth in virtual machines and cloud computing will continue to increase the demand for high-quality optical receiver and transmitter devices.

DETAILED DESCRIPTION

Figure 1:
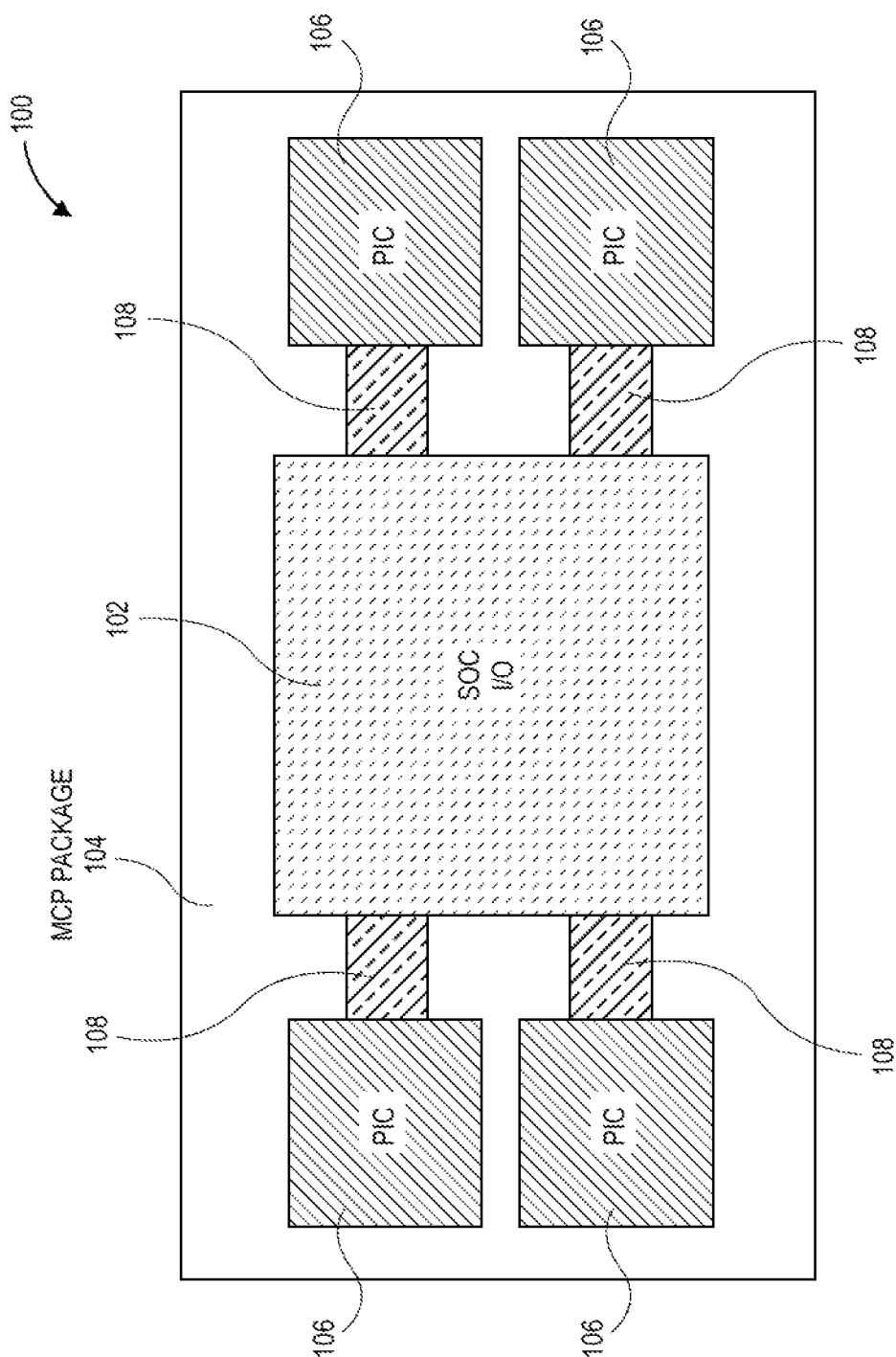
FIG. 1 illustrates an example legacy multichip package (MCP) with a single SOC die coupled with multiple photonic integrated circuits (PIC).

Embodiments described herein may be related to apparatuses, processes, and techniques related to disaggregating a SOC into multiple SOCs, and co-packaging the multiple SOCs with PICS on an MCP. The PIC may also be referred to and/or be a part of a silicon photonics engine die or a photonics die. In embodiments, multiple SOCs and PICS may be incorporated into an MCP using a stacked die structure and assembled using stacked die manufacturing techniques. In embodiments, a combination of an SOC and a PIC may be referred to as a module or a photonics module.

Embodiments described herein may facilitate modular bandwidth and form factor scaling by populating the module on the package based on total bandwidth and module bandwidth ratio. Continued bandwidth scaling drives the need for power and cost reduction to provide sustained and affordable MCP scalability. This can be achieved, in great part, through the transition of electrical I/O to photonics I/O, and from conventional photonics to integrated silicon photonics technology as described further herein.

Legacy MCP packages use a single large centralized SOC die and multiple photonics engines in a 2-D integration architecture. In these legacy implementations, electrical channels may be dense Serdes links with complicated channel compositions and topologies, or dense parallel links such as an Advanced Interface Bus™ (AIB) interface or alternative inter-die I/O over a silicon bridge. In these legacy implementations, there may be performance and scalability challenges using Serdes links due to package loss increase. In addition, the legacy architecture may result in very steep package form factor growth when scaling bandwidth, and may, in legacy implementations, exceed technology capability such as maximum manufacturable monolithic package. In addition, MB based interfaces need a multiplex/demultiplex feature to convert to a higher data rate that is able to be modulated. The additional features need silicon design implementations/space and consumes additional power and results in additional design complexity along with increased cost and power penalties.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

Various operations may be described as multiple discrete operations in turn, in a manner that is most helpful in understanding the claimed subject matter. However, the order of description should not be construed as to imply that these operations are necessarily order dependent.

As used herein, the term "module" may refer to, be part of, or include an ASIC, an electronic circuit, a processor (shared, dedicated, or group) and/or memory (shared, dedicated, or group) that execute one or more software or firmware programs, a combinational logic circuit, and/or other suitable components that provide the described functionality.

Various Figures herein may depict one or more layers of one or more package assemblies. The layers depicted herein are depicted as examples of relative positions of the layers of the different package assemblies. The layers are depicted for the purposes of explanation, and are not drawn to scale. Therefore, comparative sizes of layers should not be assumed from the Figures, and sizes, thicknesses, or dimensions may be assumed for some embodiments only where specifically indicated or discussed.

FIG. 1 illustrates an example legacy MCP with a single SOC die coupled with multiple PICs. MCP 100 shows a legacy implementation that uses a planar architecture to implement a photonics package. An SOC die 102 may be placed upon a substrate 104. In implementations, the SOC die 102 may be an XPU, a central processing unit (CPU), a graphics processing unit (GPU), a field programmable gate array (FPGA), and application-specific integrated circuit (ASIC), and/or one or more accelerators. The SOC die 102 may be a processor die that includes I/O functions and/or other functions that are integrated into the SOC die.

Various photonics engines, which may also be referred to as photonics integrated circuits (PIC) 106 are electrically coupled with the SOC 102 via various electrical interfaces 108. In implementations, these interfaces may be package interconnect or silicon bridge interconnect, for example embedded multi-die interconnect bridge (EMIB), or a silicon interposer. In embodiments, the electrical interface 108 may be a high-speed Serdes link, or a lower speed input/output (I/O) at a high density. In embodiments, the electrical interface 108 may include redistribution layer (RDL) routing on top of the substrate 104.

In legacy implementations, Serdes-based solutions within a planar architecture may have complicated channel conditions, including long substrate routing, and connector and/or through-via electrical discontinuity. As a result, these legacy implementations face significant scaling challenges, at least because additional bandwidth is achieved with further package form factor and routing length increase, as the SOC die 102 grows in size. In addition, high density, low-speed I/O requires a multiplex/demultiplex function before electro-optical signal conversion takes place, which introduces additional design complexity and includes a power penalty.

Figure 2:
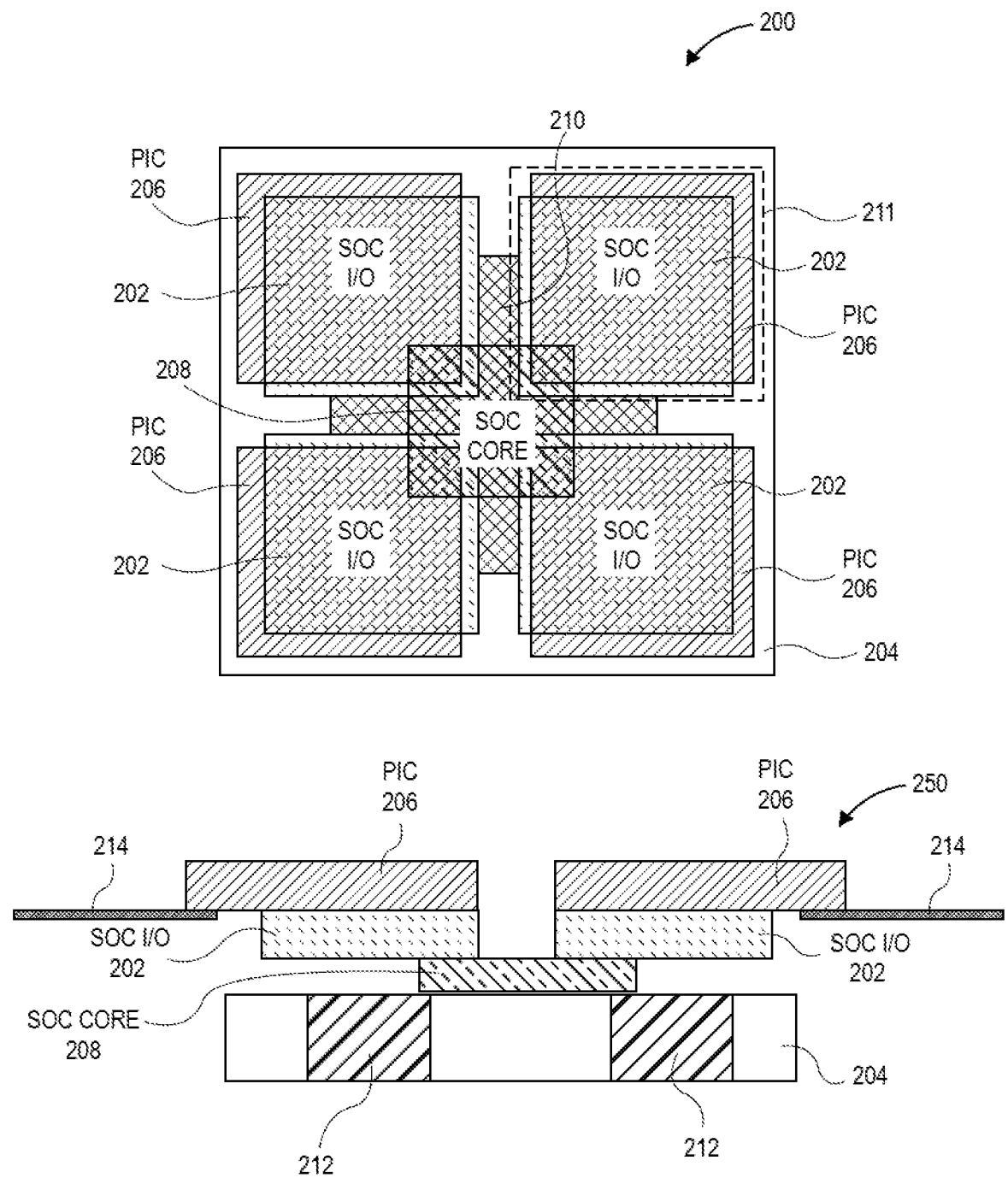
FIG. 2 illustrates a top view and a side view of an example MCP with multiple disaggregated SOC input/output (I/O) dies each coupled, respectively, with a PIC, and coupled with a shared SOC Core die, in accordance with various embodiments.

FIG. 2 illustrates a top view and a side view of an example MCP with multiple disaggregated SOC I/O dies each coupled, respectively, with a PIC, and coupled with a shared SOC Core die, in accordance with various embodiments. Top-down view 200 and side view 250 show various aspects of one embodiment of a disaggregated architecture for an MCP package. Here, the legacy SOC die 102 of FIG. 1 has been disaggregated into multiple SOC dies 202, with each SOC die 202 electrically coupled with a separate PIC 206. The disaggregation of the SOC die 102 may include placing core tile functionality and/or I/O tile functionality in a disaggregated SOC 202. In embodiments, the SOC 202 may contain only a portion of the function of the legacy SOC die 102. As shown, the SOC 202 may contain I/O functionality, for example in the form of a I/O tile (not shown), that is required for proper functional integration and communication with a PIC 206 using electrical signals that have been converted from optical signals received by the PIC 206. In other embodiments, the SOC 202 may include other functionality, including partial processing functionality, analog-to-digital or digital-to-analog conversion, or radio frequency modules.

In embodiments, an SOC Core 208 may be used to provide core functionality focused on computing (e.g. arithmetic logic unit, floating computing unit, etc.), for example in the form of a Core tile (not shown), and may electrically couple with the one or more of the other SOCs 202. In embodiments, the SOC Core 208 may couple with the substrate 204 using electrical interface 210. In embodiments, this electrical interface 210 may be an interconnect bridge, a silicon interposer, or an RDL layer on top of the substrate 204. In embodiments, the electrical interface 210 may be an EMIB.

As shown, the disaggregated SOCs 202 and PICS 206, when electrically coupled, form a SOC/PIC module 211. The SOC/PIC module 211 may be incorporated into MCPs using a modular stacked die format. In embodiments, an SOC die 202 with I/O functionality may be designed to match its I/O bandwidth to the PIC 206's electrical and optical bandwidth. In embodiments (as shown) the SOC die 202 may be offset from the PIC 206 to form an overhang of the PIC 206 to allow for optical fiber 214 attachment.

This modular stacked die format allows the electrical links between the SOC die 202 and the PIC 206 to be significantly simplified, for example to micro-bumps and through silicon vias (TSV) to allow bandwidth scaling instead of going through micro-bumps, vias and traces. These connections can support higher performance and density through either Serdes or high density low speed I/O implementations. In addition, this modular stacked die format also provides 110 protocol flexibility without data rate conversion given that high density and high speed I/Os can directly transmit in between the SOC I/O dies and PIC dies, and design and/or power benefits by avoiding multiplex/demultiplex features which would have been included in the SOC IO die or PIC die.

In addition, the disaggregation of the legacy SOC die 102 reduces design complexity of the SOC dies 202. Embodiments include disaggregating SOC Core 208 and SOC I/O modules 202, and relying on various forms of electrical interface 210 routing, for example package routing, silicon bridge, or interposer routing for inter-SOC 202 die communication.

As shown in side view 250, the SOC Core 208 serves all SOC dies 202, and may be physically coupled with the substrate 204. In other embodiments, the SOC Core 208 may be embedded (not shown) within the substrate 204. In these embodiments, the SOC dies 202 may be electrically and/or physically coupled with the substrate 204. In any of the embodiments, thermally conductive elements 212, for example thermal copper plugs, may be included within the substrate 204 to route heat transfer in the substrate 204 direction that is generated by the SOCs die 202 or by the SOC Core 208.

The distribution of the SOC features and modular scaling allows for this more friendly thermal profile, and reduces the challenges of implementing a thermal solution using legacy SOC die 102. In embodiments, having a single SOC Core die 208 service multiple SOC/PIC modules 211 may create some limitations on scalability, but in embodiments it will simplify the on-package I/O and may be in a set of preferred solution for low module size architectures.

Figure 3:
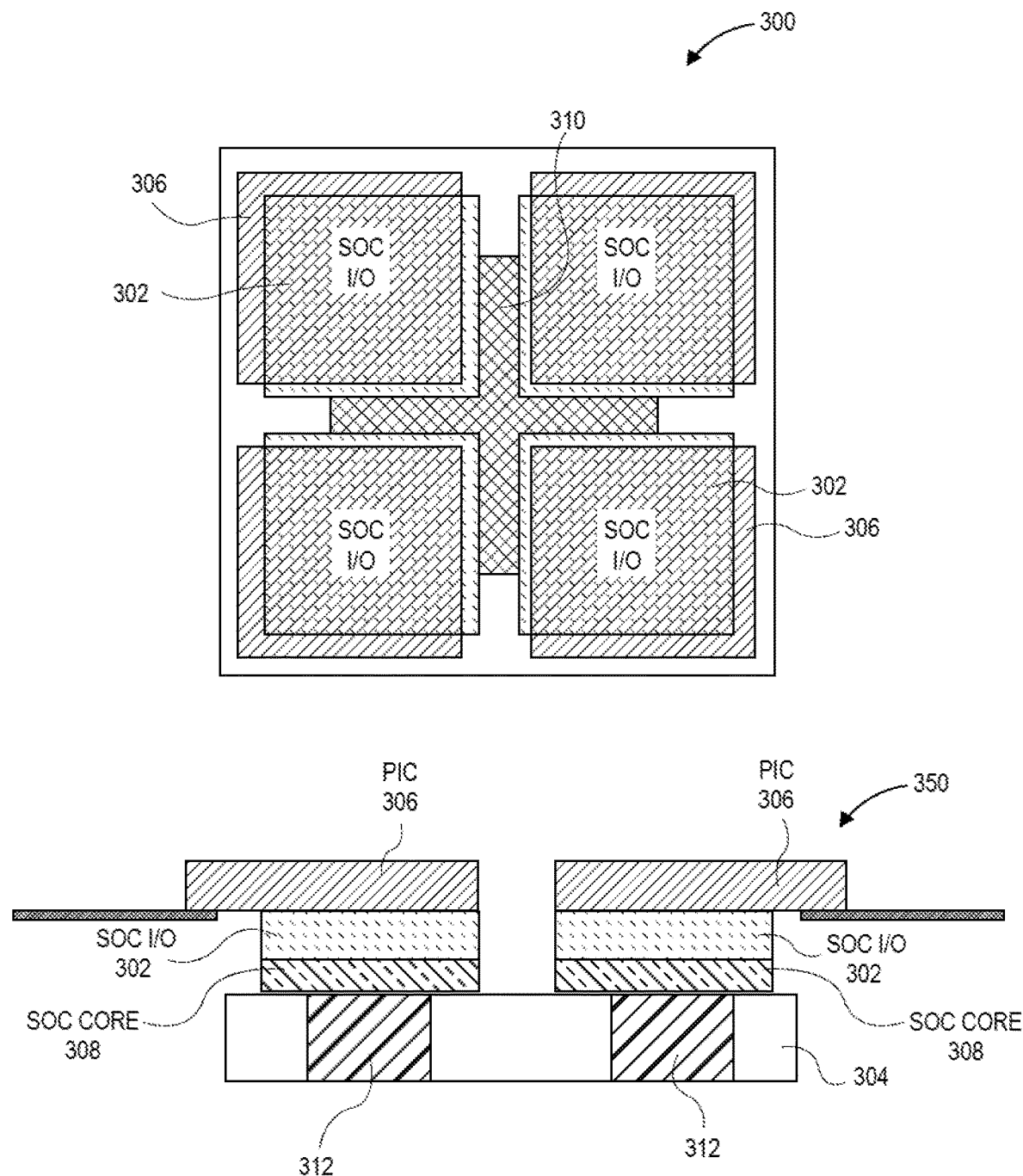
FIG. 3 illustrates a top view and a side view of an example MCP with multiple disaggregated SOC input/output (I/O) dies each coupled, respectively, with a PIC and with an SOC Core, in accordance with various embodiments.

FIG. 3 illustrates a top view and a side view of an example MCP with multiple disaggregated SOC I/O dies each coupled, respectively, with a PIC and with an SOC Core, in accordance with various embodiments. Top-down view 300 and side view 350 show various aspects of another embodiment of a disaggregated architecture for an MCP package. As shown, there is an individual SOC Core die 308 coupled to each SOC I/O die 302, which in turn are coupled with a PIC 306. The SOC Core dies 308 may be electrically coupled using electrical interface 310, which may be similar to electrical interface 210 of FIG. 2.

In embodiments, directly electrically coupling and SOC Core die 308 and an SOC I/O die 302 may provide short path electrical routing between various functions that ordinarily would be found in a larger legacy SOC die 102 of FIG. 1. Thus, in this configuration there may be increased speed and/or higher bandwidth conductivity between SOC functions as implemented in MCP 300 versus as implemented in legacy MCP 100.

In addition, thermally conductive elements 312, which may be similar to thermally conductive elements 212 of FIG. 2, may be designed to be aligned with the SOC Core dies 308 in order to route heat generated from the SOC I/O dies 302 and the SOC Core dies 308 through the substrate 304.

Figure 4:
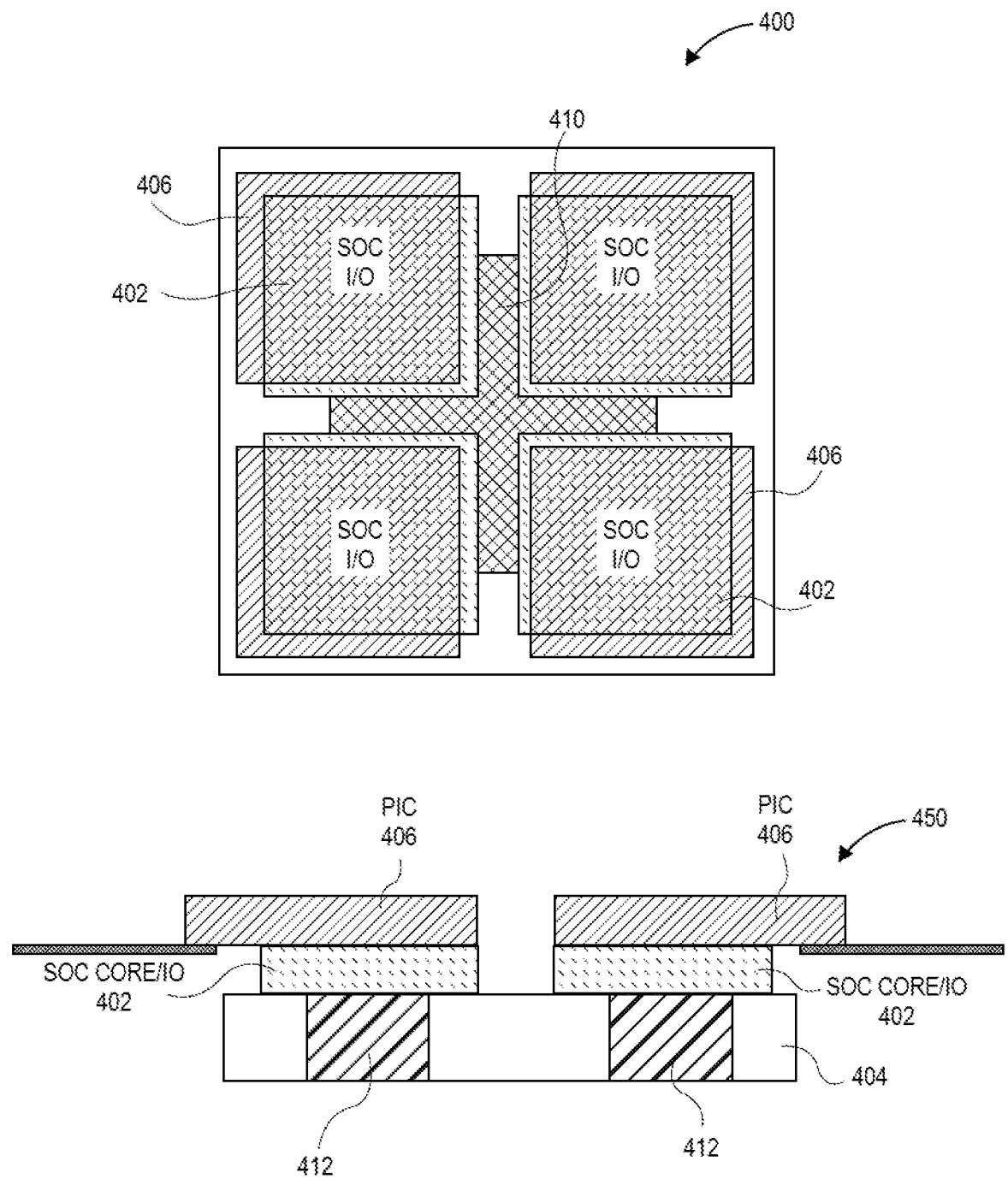
FIG. 4 illustrates a top view and a side view of an example MCP with multiple disaggregated combination SOC Core I/O dies, each coupled, respectively, with a PIC, in accordance with various embodiments.

FIG. 4 illustrates a top view and a side view of an example MCP with multiple disaggregated combination SOC Core I/O dies, each coupled, respectively, with a PIC, in accordance with various embodiments. Top-down view 400 and side view 450 show various aspects of another embodiment of a disaggregated architecture for an MCP package. SOC die 402 and PIC 406 may be similar to SOC I/O dies 302 and PIC 306 of FIG. 3. However, as shown, SOC die 402 includes both I/O and Core functionality within the SOC.

In embodiments, and I/O tile and a Core tile may be incorporated into the SOC die 402. In these embodiments, each PIC 406 will have direct and exclusive electrical access to Core and I/O functions. In these and similar embodiments, the SOC die 402 will electrically couple with the substrate 404 using electrical interface 410, which may be similar to electrical interface 310 of FIG. 3. Additionally, thermal features 412 may be aligned within the substrate 404 in order to provide thermal conductivity of heat generated by the SOC die 402 through the substrate 404.

It should be appreciated that the PIC 406 and SOC die 402, while configured as four SOC/PIC modules in a symmetrical pattern within MCP 400 as shown, the SOC/PIC modules may be placed within the MCP 400 in any configuration, for example the SOC/PIC modules may be placed in a row, or may be placed in an asymmetrical fashion on the electrical interface 410. One example of this is discussed below with respect to FIG. 5.

Figure 5:
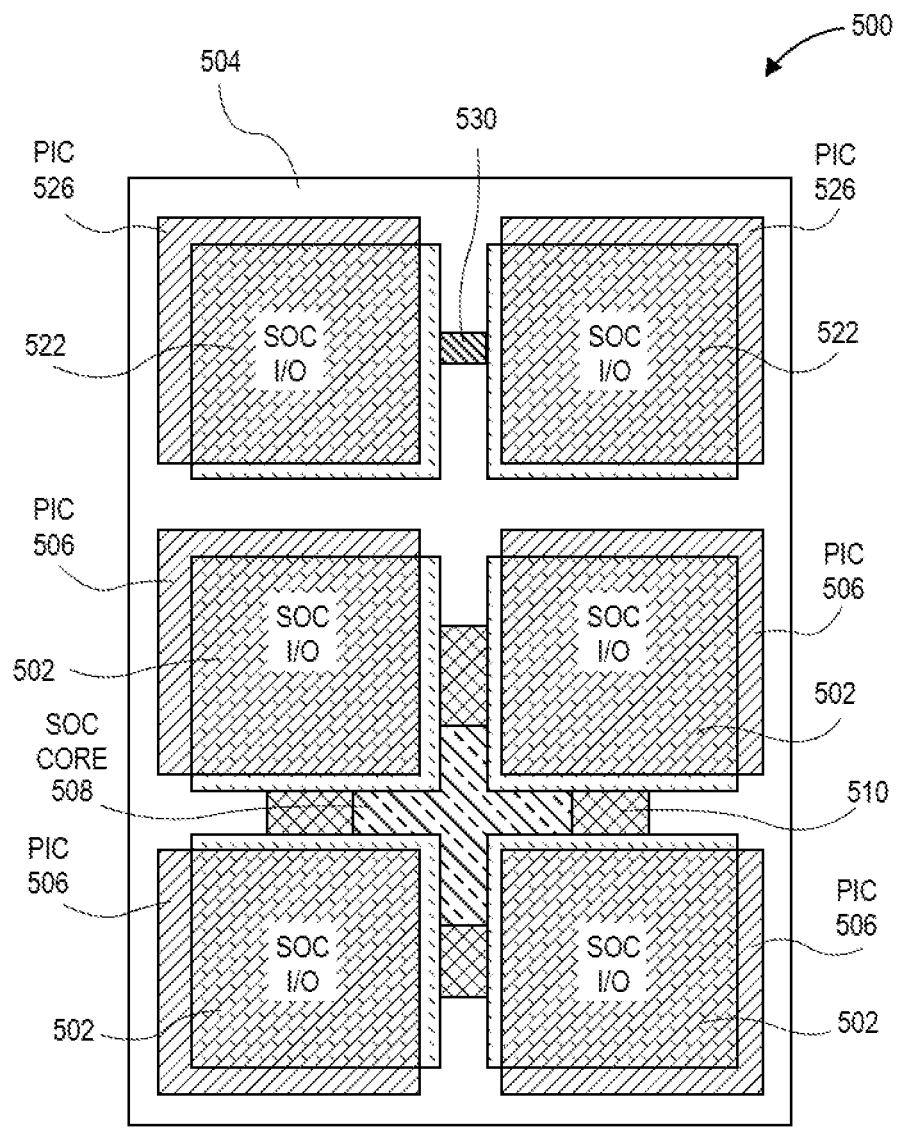
FIG. 5 illustrates a top view of an example MCP with multiple disaggregated SOC dies coupled, respectively, with a PIC, where the SOC dies are electrically coupled using various electrical interfaces, in accordance with various embodiments.

FIG. 5 illustrates a top view of an example MCP with multiple disaggregated SOC dies coupled, respectively, with a PIC, where the SOC dies are electrically coupled using various electrical interfaces, in accordance with various embodiments. MCP 500 shows a hybrid implementation of some of the embodiments as described above with respect to FIGS. 2-4. In a portion of MCP 500, multiple SOC I/O dies 502 are electrically coupled with PICS 506. Each of the multiple SOC I/O dies 502 are coupled with an interposer 510. The interposer 510 may be physically coupled and/or electrically coupled with the substrate 504.

In another portion of MCP 500, PICS 526 are coupled with SOC Core I/O dies 522. The SOC Core I/O dies 522 are electrically coupled using an EMIB 530 that is embedded in substrate 504. In addition, the SOC Core I/O dies 522 may also be physically and/or electrically coupled with the substrate 504. In embodiments, the combination of the PIC 506 and the SOC I/O dies 502, as compared with the PIC 526 and SOC Core I/O dies 522, may provide different levels of functionality, or different service levels to the various optical fibers (not shown) that may be optically coupled with PICS 506, 526 within MCP 500.

Figure 6:
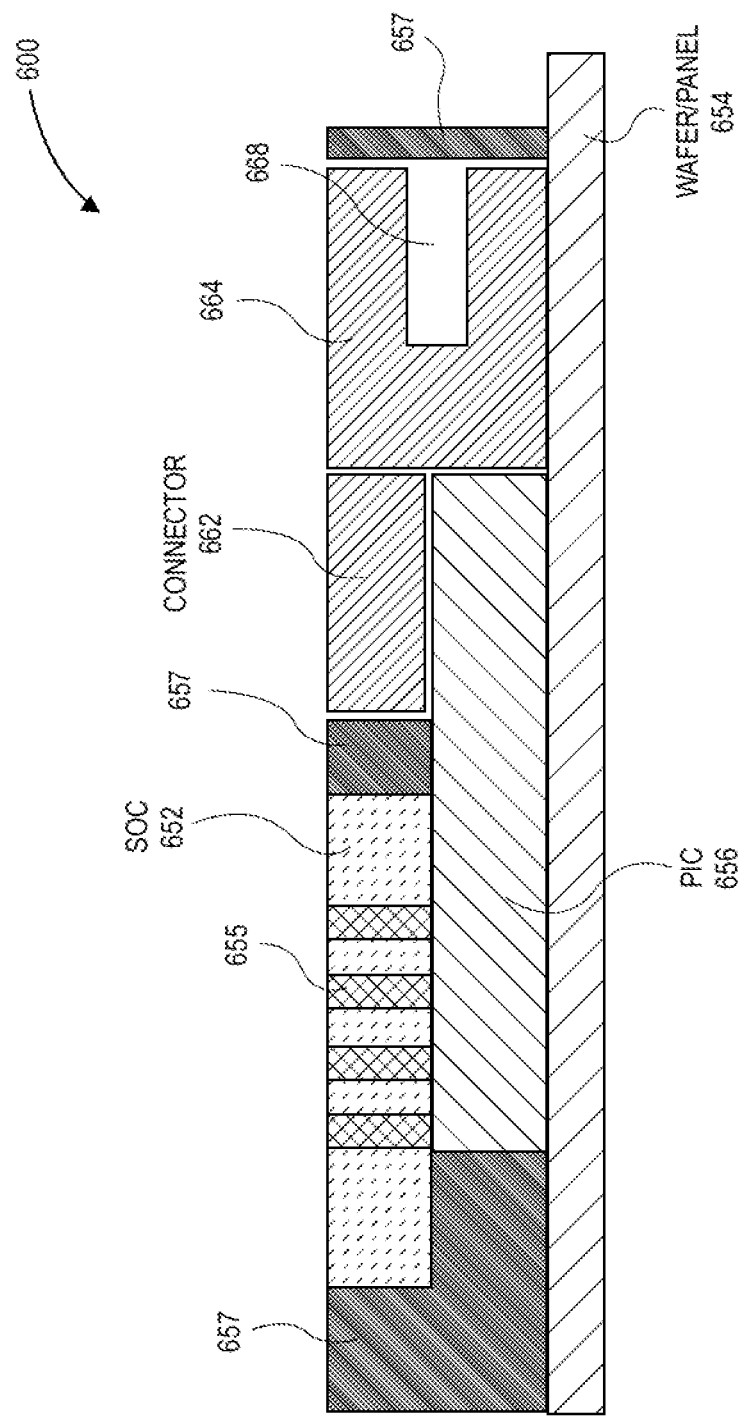
FIG. 6 illustrates a side view of an example chiplet module used to create an MCP in one stage of manufacture, in accordance with various embodiments.

FIG. 6 illustrates a side view of an example chiplet module used to create an MCP at a particular stage of manufacture, in accordance with various embodiments. SOC/PIC module 600, which may be similar to SOC/PIC module 211 of FIG. 2, is also shown in portions of FIGS. 2-5 as PIC 206 coupled with SOC 202 of FIG. 2, PIC 306 coupled with SOC 302 of FIG. 3, PIC 406 coupled with SOC 402 of FIG. 4, and PIC 506, 526 coupled, respectively, with SOC 502, 522. In embodiments, SOC/PIC module 600 is shown at one stage of manufacture.

As shown, a wafer or panel 654 may be physically coupled with a PIC 656. The PIC 656 may be similar to PIC 206 of FIG. 2. The PIC 656 may be physically and/or electrically coupled with SOC 652, which may be similar to SOC 202 of FIG. 2. In embodiments, the SOC 652 may include one or more copper pillars or through silicon vias (TSV) 655 that may provide power to the PIC 656 after final assembly as described below.

An optical connector 662 may be optically coupled with the PIC 656. In embodiments, this optical connector 662 may be lens to lens, or a waveguide to waveguide coupling. In embodiments, an optical fiber coupling 664 may be optically coupled with the optical connector 662. In embodiments, the optical fiber coupling 664 is to physically receive one or more optical fiber into socket 668 of the optical fiber coupling 664. In embodiments, a filler material 657 may be placed proximate to the socket 668 to prevent dust or debris from entering the socket 668. In embodiments, this filler material 657 may be subsequently removed. Subsequent to manufacture, the SOC/PIC module 600 may be tested after singulation, so known good SOC/PIC modules 600 may be used for further assembly as described below with respect to FIG. 7. An example process 900 of manufacturing portions of a SOC/PIC module 600 is discussed in greater detail with respect to FIG. 9.

Figure 7:
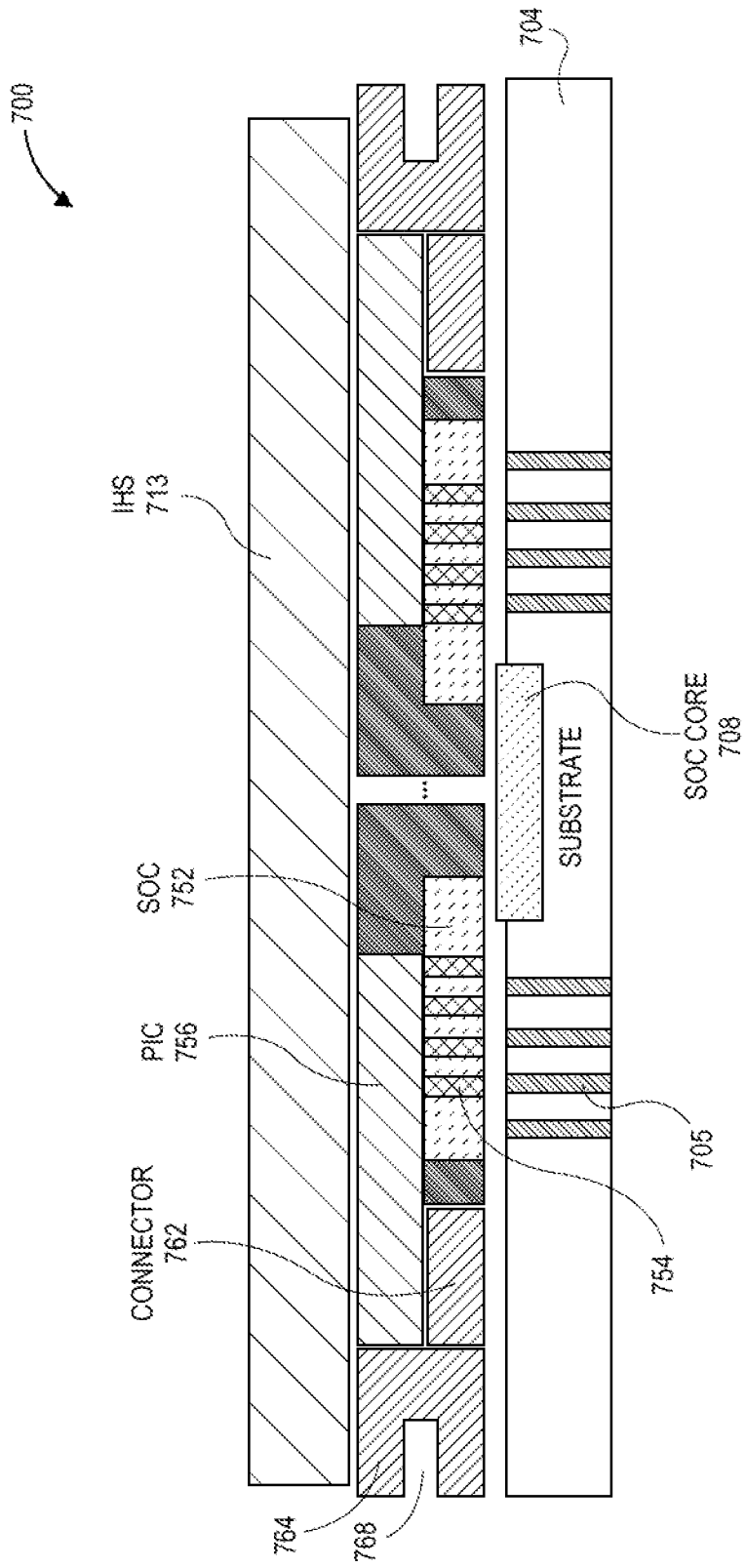
FIG. 7 illustrates a side view of an MCP created with multiple chiplet modules, in accordance with various embodiments.

FIG. 7 illustrates a side view of an MCP created with multiple chiplet modules, in accordance with various embodiments. MCP 700 may represent a final stage of manufacture. In embodiments, two or more SOC/PIC modules 600 of FIG. 6 may be flipped and attached to a substrate 704. A SOC/PIC module may include a SOC 752, in this case a I/O SOC, that includes one or more copper pillars 754, which may be similar to SOC 652 and copper pillars 654 of FIG. 6.

The SOC/PIC module may include a PIC 756 electrically coupled with the SOC 752, and also coupled with an optical connector 762 that is coupled with an optical fiber coupling 764 that may include a socket 768 and to which an optical fiber may be inserted. These components may be similar to optical connector 662, optical fiber coupling 664, and socket 668 of FIG. 6. The wafer/panel 654 has been removed, and an integrated heat spreader (IHS) 713 has been added that is thermally coupled with the multiple PICs 756.

Figure 8:
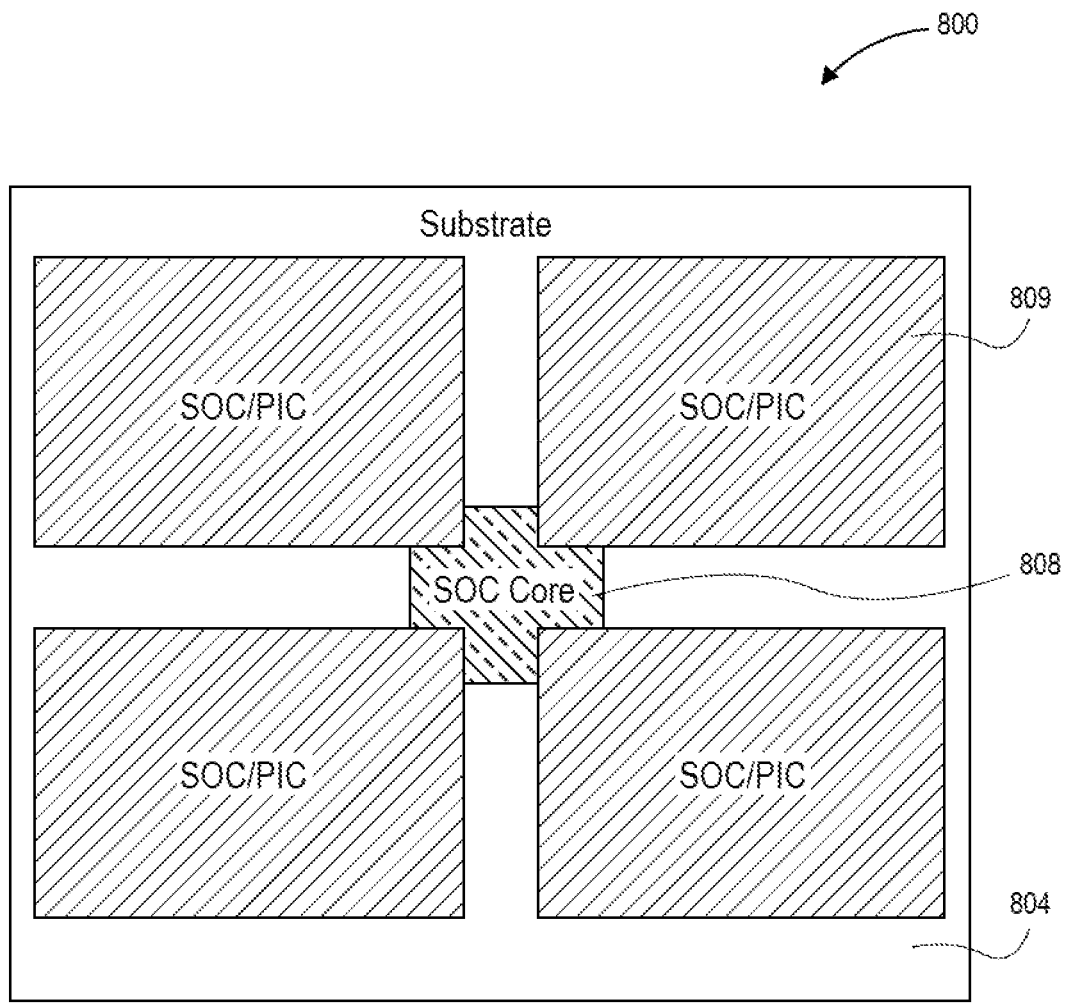
FIG. 8 illustrates a top-down view of an MCP created with multiple template modules, in accordance with various embodiments.

The substrate 704 may include cooling channels 705 that may be used to draw heat from the SOC 752 during operation of the MCP 700. In embodiments, the cooling channels 705 may be copper pillars, or may be any other arrangement of thermally conductive material within the substrate 704. In addition, a SOC Core die 708, which may be similar to SOC Core die 208 of FIG. 2, may be embedded within the substrate 704 to electrically couple the multiple SOC 752. In other embodiments, the SOC Core function may be located in the SOC 752, in which case the SOC core 708 may actually be an EMIB to electrically couple the multiple SOC 752 at a high data rate. In other implementations, FIG. 8 illustrates a top-down view of an MCP created with multiple SOC/PIC modules, in accordance with various embodiments. MCP 800, which may be similar to a top-down view of MCP 700 and FIG. 7, includes a substrate 804 which may be similar to substrate 704, to which an SOC Core die 808, which may be similar to SOC Core die 708, may be coupled. In embodiments, the SOC Core die 808 may be recessed into the substrate 804.

Multiple SOC/PIC modules 809, which may be similar to SOC/PIC module 600 of FIG. 6, may be electrically coupled with the SOC Core die 808. In embodiments, an electrical interface, similar to electrical interface 210 of FIG. 2, may be applied to the substrate 804 to electrically couple the SOC/PIC modules 809.

Figure 9:
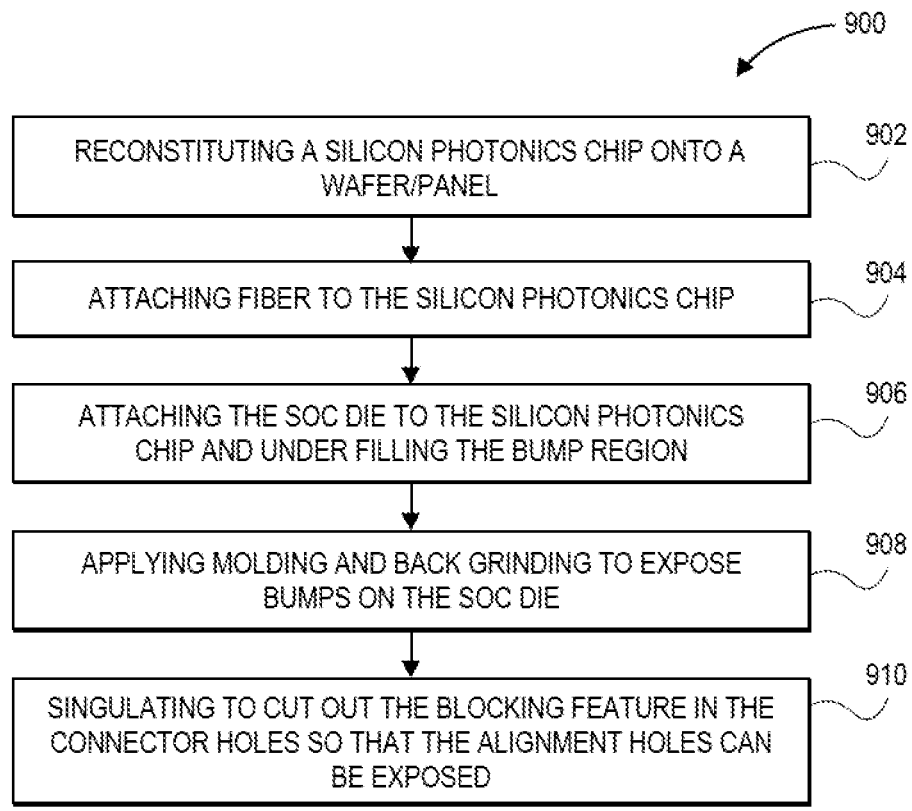
FIG. 9 illustrates an example process for manufacturing a chiplet module, in accordance with various embodiments.

FIG. 9 illustrates an example process for manufacturing a chiplet module, in accordance with various embodiments. Process 900 may be implemented by techniques, processes, apparatus, or systems as described or related to embodiments described herein, and particularly with respect to FIGS. 2-8.

At block 902, the process may include reconstituting a silicon photonics chip onto a wafer/panel. In embodiments, the silicon photonics chip may be similar to PIC 656 of FIG. 6, and the wafer/panel may be similar to wafer/panel 654 of FIG. 6. In embodiments, the silicon photonics chip may include light generation, optical signal processing, and/or other photonics-related functions within the chip. In embodiments, the silicon photonics chip may be a silicon photonics die.

At block 904, the process may include attaching fiber to the silicon photonics chip. In embodiments, this attachment process may include using optical epoxy. In embodiments, this may include optically coupling an optical connector, such as optical connector 662, to PIC 656 as shown in FIG. 6. In embodiments, a dam barrier (not shown) may be used between a bump and V-groove region on the PIC 656 (not shown) to avoid overflow of the epoxy.

At block 906, the process may further include attaching the SOC die to the silicon photonics chip and under filling the bump region. In embodiments, this may include attaching SOC die 652 of FIG. 6 to PIC 656. In embodiments, copper pillars or TSVs 655 within SOC die 652 may be used to electrically couple the PIC 656 to other components attached to the SOC die 652.

At block 908, the process may further include applying molding and back grinding to expose bumps on the SOC die. In embodiments, molding 657 of FIG. 6 may be applied to the SOC/PIC module 600. In embodiments, the molding 657 may be a dielectric, or may be another compound with thermal conductive features to facilitate heat routing within SOC/PIC module 600. In embodiments grinding may expose bumps (not shown) on the SOC die 652, which may include bump features associated with copper pillars or TSVs 655 of FIG. 6. In embodiments, these exposed bumps (not shown) may facilitate electronic coupling with an electrical interface, such as electrical interface 210 of FIG. 2, or with a substrate, such as substrate 704 of FIG. 7.

At block 910, the process may further include singulating to cut out the blocking feature in the connector holes so that the alignment holes can be exposed. This singulation may include dicing the wafer to isolate the individual chiplet modules for inspection and for quality assurance testing.

Figure 10:
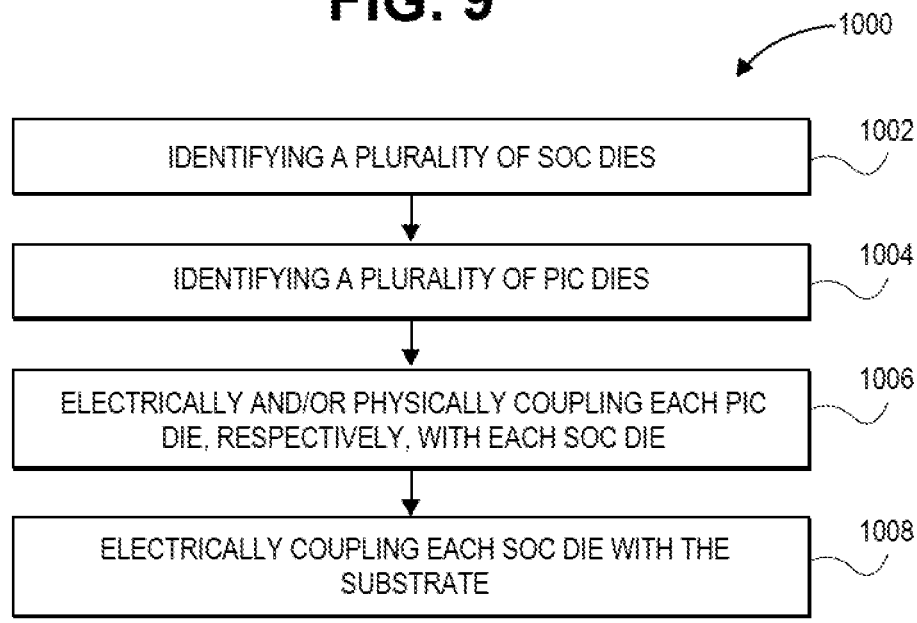
FIG. 10 illustrates an example process for building an MCP that includes multiple SOCs, in accordance with various embodiments.

FIG. 10 illustrates an example process for building an MCP that includes multiple SOCs, in accordance with various embodiments. Process 1000 may be implemented using techniques, processes, apparatus, or systems as described or related to embodiments described herein, and particularly with respect to FIGS. 2-9.

At block 1002 the process may include identifying a plurality of SOC dies. In embodiments, the SOC dies may include SOC dies 202 of FIG. 2, 302 of FIG. 3, 402 of FIG. 4, 502, 522 of FIG. 5, 652 of FIG. 6, and/or 752 of FIG. 7. In embodiments, the SOC dies may represent dies that are disaggregated from a legacy SOC die 102 of FIG. 1.

In embodiments, the SOC dies may be an SOC I/O die, for example an SOC die that includes an I/O chiplet, a SOC Core die, for example an SOC die that includes a Core chiplet, or an SOC Core I/O die that includes both a Core chiplet and an I/O chiplet. In embodiments, the SOC dies may include one or more TSV's or copper pillars, for example as shown with TSVs or copper pillars 655 of FIG. 6.

At block 1004, the process may include identifying a plurality of PIC dies. In embodiments, the PIC dies may include PIC dies 206 of FIG. 2, 306 of FIG. 3, 406 of FIG. 4, 506, 526 of FIG. 5, 656 of FIG. 6, and/or 756 of FIG. 7. In embodiments, the PIC dies may be photonics engines. In embodiments, the PIC dies may include light generation capabilities. In embodiments, the PIC dies may be optical transmitters, optical receivers, or optical transceivers.

At block 1006, the process may include electrically and physically coupling each PIC die, respectively, with each SOC die. In embodiments, electrically and/or physically coupling a PIC die within SOC die may be referred to as an SOC/PIC module, such as SOC/PIC module 211 of FIG. 2. In embodiments, the SOC and PIC may be coupled using micro-bumps, bumps, solder balls, or other coupling technology. Other embodiments of coupling SOCs and PICS may be described with respect to FIG. 6.

At block 1008, the process may include electrically coupling each SOC die with the substrate. In embodiments, coupling each SOC die with the substrate may be accomplished with the SOCs is described with respect to block 1002. In other embodiments, the SOC die may refer to an SOC Core die, such as SOC Core die 208 of FIG. 2, SOC core die 308 of FIG. 3, SOC Core I/O die 402 of FIG. 4, SOC Core die 508 of FIG. 5, and/or SOC core die 708 of FIG. 7. The substrate may be similar to substrate 204 of FIG. 2, 304 of FIG. 3, 404 of FIG. 4, 504 of FIG. 5, and/or 704 of FIG. 7.

In embodiments, the substrate may include an electrical interface, such as electrical interface 210 of FIG. 2, 310 of FIG. 3, 410 of FIG. 4, 510, 530 of FIG. 5, and/or 708 of FIG. 7. In embodiments, the electrical interface may include an EMIB, OCB, silicon or other interposer, or organic routing.

Figure 11:
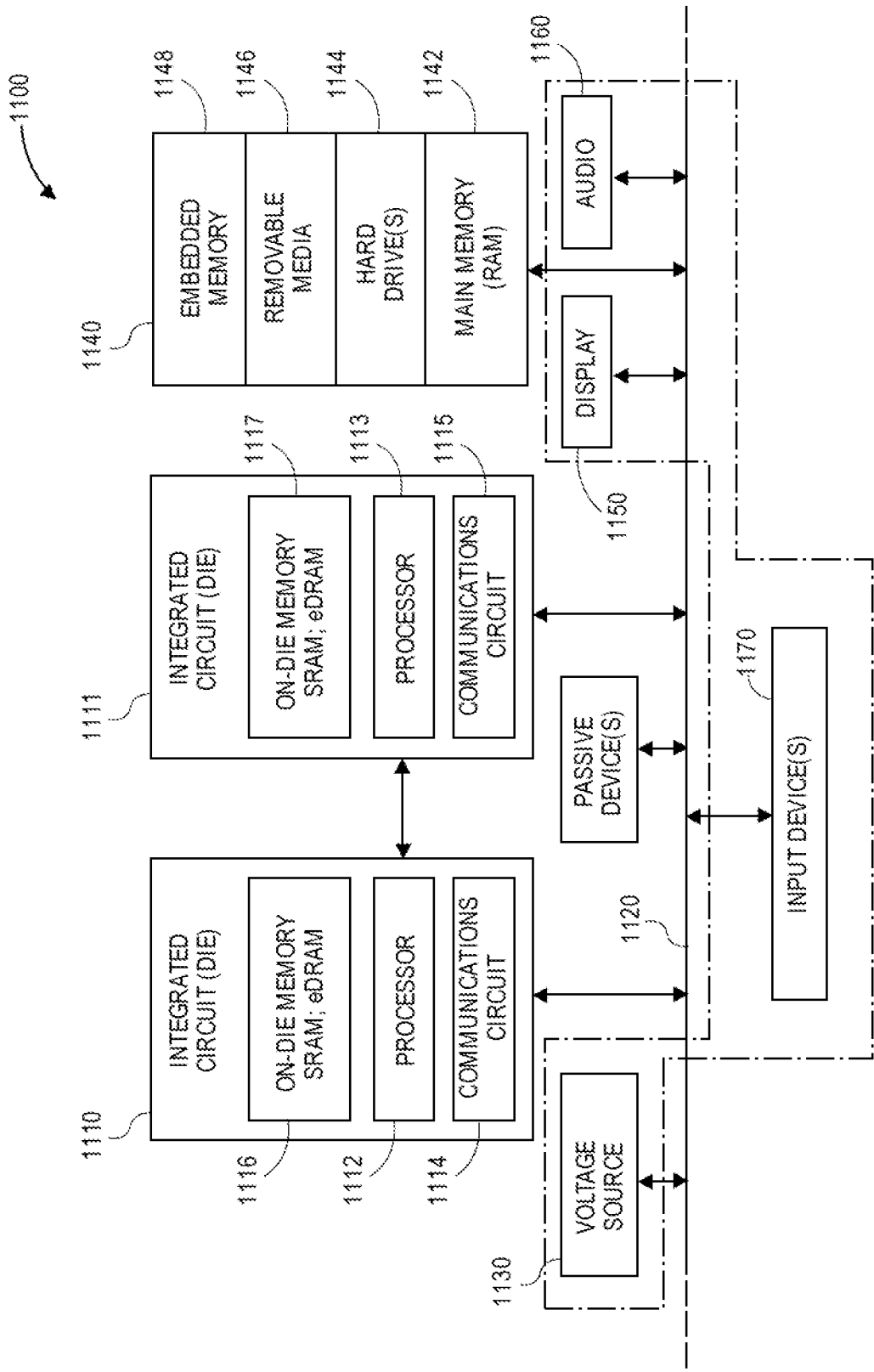
FIG. 11 schematically illustrates a computing device, in accordance with embodiments.

FIG. 11 schematically illustrates a computing device, in accordance with embodiments. The computer system 1100 (also referred to as the electronic system 1100) as depicted can embody all or part of an optical multichip package with multiple SOC dies, according to any of the several disclosed embodiments and their equivalents as set forth in this disclosure. The computer system 1100 may be a mobile device such as a netbook computer. The computer system 1100 may be a mobile device such as a wireless smart phone.

The computer system 1100 may be a desktop computer. The computer system 1100 may be a hand-held reader. The computer system 1100 may be a server system. The computer system 1100 may be a supercomputer or high-performance computing system.

In an embodiment, the electronic system 1100 is a computer system that includes a system bus 1120 to electrically couple the various components of the electronic system 1100. The system bus 1120 is a single bus or any combination of busses according to various embodiments. The electronic system 1100 includes a voltage source 1130 that provides power to the integrated circuit 1110. In some embodiments, the voltage source 1130 supplies current to the integrated circuit 1110 through the system bus 1120.

The integrated circuit 1110 is electrically coupled to the system bus 1120 and includes any circuit, or combination of circuits according to an embodiment. In an embodiment, the integrated circuit 1110 includes a processor 1112 that can be of any type. As used herein, the processor 1112 may mean any type of circuit such as, but not limited to, a microprocessor, a microcontroller, a graphics processor, a digital signal processor, or another processor. In an embodiment, the processor 1112 includes, or is coupled with, all or part of an optical multichip package with multiple SOC dies, as disclosed herein. In an embodiment, SRAM embodiments are found in memory caches of the processor. Other types of circuits that can be included in the integrated circuit 1110 are a custom circuit or an application-specific integrated circuit (ASIC), such as a communications circuit 1114 for use in wireless devices such as cellular telephones, smart phones, pagers, portable computers, two-way radios, and similar electronic systems, or a communications circuit for servers. In an embodiment, the integrated circuit 1110 includes on-die memory 1116 such as static random-access memory (SRAM). In an embodiment, the integrated circuit 1110 includes embedded on-die memory 1116 such as embedded dynamic random-access memory (eDRAM).

In an embodiment, the integrated circuit 1110 is complemented with a subsequent integrated circuit 1111. Useful embodiments include a dual processor 1113 and a dual communications circuit 1115 and dual on-die memory 1117 such as SRAM. In an embodiment, the dual integrated circuit 1110 includes embedded on-die memory 1117 such as eDRAM.

In an embodiment, the electronic system 1100 also includes an external memory 1140 that in turn may include one or more memory elements suitable to the particular application, such as a main memory 1142 in the form of RAM, one or more hard drives 1144, and/or one or more drives that handle removable media 1146, such as diskettes, compact disks (CDs), digital variable disks (DVDs), flash memory drives, and other removable media known in the art. The external memory 1140 may also be embedded memory 1148 such as the first die in a die stack, according to an embodiment.

In an embodiment, the electronic system 1100 also includes a display device 1150, an audio output 1160. In an embodiment, the electronic system 1100 includes an input device such as a controller 1170 that may be a keyboard, mouse, trackball, game controller, microphone, voice-recognition device, or any other input device that inputs information into the electronic system 1100. In an embodiment, an input device 1170 is a camera. In an embodiment, an input device 1170 is a digital sound recorder. In an embodiment, an input device 1170 is a camera and a digital sound recorder.

As shown herein, the integrated circuit 1110 can be implemented in a number of different embodiments, including all or part of an optical multichip package with multiple SOC dies, according to any of the several disclosed embodiments and their equivalents, an electronic system, a computer system, one or more methods of fabricating an integrated circuit, and one or more methods of fabricating an electronic assembly that includes a package substrate implementing all or part of an optical multichip package with multiple SOC dies, according to any of the several disclosed embodiments as set forth herein in the various embodiments and their art-recognized equivalents. The elements, materials, geometries, dimensions, and sequence of operations can all be varied to suit particular I/O coupling requirements including array contact count, array contact configuration for a microelectronic die embedded in a processor mounting substrate according to any of the several disclosed processes used for an optical multichip package with multiple SOC dies and their equivalents. A foundation substrate may be included, as represented by the dashed line of FIG. 11. Passive devices may also be included, as is also depicted in FIG. 11.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated embodiments, including what is described in the Abstract, is not intended to be exhaustive or to limit embodiments to the precise forms disclosed. While specific embodiments are described herein for illustrative purposes, various equivalent modifications are possible within the scope of the embodiments, as those skilled in the relevant art will recognize.

These modifications may be made to the embodiments in light of the above detailed description. The terms used in the following claims should not be construed to limit the embodiments to the specific implementations disclosed in the specification and the claims. Rather, the scope of the invention is to be determined entirely by the following claims, which are to be construed in accordance with established doctrines of claim interpretation.

The following paragraphs describe examples of various embodiments.

Examples

Example 1 is a package comprising: a plurality of system on-chip (SOC) dies; a plurality of photonic integrated circuit (PIC) dies, each PIC die electrically coupled, respectively, with each SOC die; and a substrate electrically coupled with each of the electrically coupled SOC dies and PIC dies.

Example 2 may include the package of example 1, wherein the plurality of PIC dies and the plurality of SOC dies are, respectively, physically coupled.

Example 3 may include the package of example 1, wherein each SOC is electrically and physically coupled to the substrate.

Example 4 may include the package of example 3, wherein one or more regions of the substrate proximate to a physical coupling of an SOC to the substrate include a thermally conductive material to route heat from the SOC through the substrate.

Example 5 may include the package of example 4, wherein the thermally conductive material is a copper plug.

Example 6 may include the package of example 1, wherein a subset of the plurality of SOC dies are electrically coupled by a selected one or more of: an interconnect bridge, a silicon interposer, a redistribution layer (RDL) routing on the substrate, an embedded multi-die interconnect bridge (EMIB), or an open cavity bridge (OCB).

Example 7 may include the package of example 1, wherein the SOC die is a selected one of: an SOC input/output (I/O) die, an SOC Core die, or a combination SOC Core I/O die.

Example 8 may include the package of example 1, wherein the plurality of SOC dies are a plurality of combination SOC Core I/O dies.

Example 9 may include the package of example 8, wherein the plurality of combination SOC Core I/O dies are physically coupled with the substrate.

Example 10 may include the package of example 1, wherein the plurality of SOC dies are a plurality of SOC I/O dies; and further comprising a plurality of SOC Core dies that are electrically coupled, respectively, with the plurality of SOC I/O dies, wherein the plurality of SOC Core dies are electrically and physically coupled to the substrate.

Example 11 may include the package of example 1, further comprising an SOC Core die electrically coupled with a first side of a subset of the plurality of SOC dies.

Example 12 may include the package of example 11, wherein the SOC core die is physically coupled with the substrate.

Example 13 may include the package of any one of examples 1-12, wherein the SOC is a selected one of: a central processing unit (CPU), a graphics processing unit (GPU), a field programmable gate array (FPGA), or an application-specific integrated circuit (ASIC).

Example 14 is a method comprising: identifying a plurality of system on-chip (SOC) dies; identifying a plurality of photonic integrated circuit (PIC) dies; electrically and physically coupling each PIC die, respectively, with each SOC die; and electrically coupling each SOC die with a substrate.

Example 15 may include the method of example 14, wherein the SOC dies are SOC Core I/O dies; and wherein electrically coupling each SOC with a substrate further includes electrically and physically coupling each SOC Core I/O die with the substrate.

Example 16 may include the method of example 14, wherein the SOC dies are SOC I/O dies; and further comprising after electrically and physically coupling each PIC die respectively with each SOC die: identifying a plurality of SOC Core dies; and electrically and physically coupling each SOC core die, respectively, with each SOC die; and wherein electrically coupling each SOC die with a substrate further includes electrically and physically coupling the plurality of SOC Core dies to the substrate.

Example 17 may include the method of any one of examples 14-16, wherein the SOC dies are SOC I/O dies; and further comprising after electrically and physically coupling each PIC die respectively with each SOC die: identifying a SOC Core die; electrically and physically coupling the SOC core die with each of the plurality of SOC I/O dies; and electrically and physically coupling the SOC core die with the substrate.

Example 18 is a system, comprising: a multichip package comprising: a plurality of system on-chip (SOC) dies; a plurality of photonic integrated circuit (PIC) dies, each PIC die electrically coupled, respectively, with each SOC die; and a substrate electrically coupled with each of the electrically coupled SOC dies and PIC dies; and a printed circuit board (PCB) electrically and/or physically coupled with the multichip package.

Example 19 may include the system of example 18, wherein the multichip package is multiple multichip packages.

Example 20 may include the system of any one of examples 18-19, further comprising optical fibers coupled with the plurality of PICS.

What is claimed is:

1. A package comprising:
   a plurality of system on-chip (SOC) dies;
   a plurality of photonic integrated circuit (PIC) dies, each PIC die electrically coupled, respectively, with a corresponding SOC die;
   an SOC Core die; and
   a substrate electrically coupled with each of the electrically coupled SOC dies and PIC dies and with the SOC core die, wherein the plurality of SOC dies are vertically between the SOC Core die and the plurality of PIC dies, and wherein the SOC Core die is vertically between the plurality of SOC dies and the substrate.

2. The package of claim 1, wherein the plurality of PIC dies and the plurality of SOC dies are, respectively, physically coupled.

3. The package of claim 1, wherein each SOC is electrically and physically coupled to the substrate.

4. The package of claim 3, wherein one or more regions of the substrate proximate to a physical coupling of an SOC to the substrate include a thermally conductive material to route heat from the SOC through the substrate.

5. The package of claim 4, wherein the thermally conductive material is a copper plug.

6. The package of claim 1, wherein a subset of the plurality of SOC dies are electrically coupled by a selected one or more of: an interconnect bridge, a silicon interposer, a redistribution layer (RDL) routing on the substrate, an embedded multi-die interconnect bridge (EMIB), or an open cavity bridge (OCB).

7. The package of claim 1, wherein the SOC die is a selected one of: an SOC input/output (I/O) die, an SOC Core die, or a combination SOC Core I/O die.

8. The package of claim 1, wherein the plurality of SOC dies are a plurality of combination SOC Core I/O dies.

9. The package of claim 8, wherein the plurality of combination SOC Core I/O dies are physically coupled with the substrate.

10. The package of claim 1, wherein the plurality of SOC dies are a plurality of SOC I/O dies.

11. The package of claim 1, wherein the SOC is a selected one of: a central processing unit (CPU), a graphics processing unit (GPU), a field programmable gate array (FPGA), or an application-specific integrated circuit (ASIC).

12. A method comprising:
   identifying a plurality of system on-chip (SOC) dies;
   identifying a plurality of photonic integrated circuit (PIC) dies;
   electrically and physically coupling each PIC die, respectively, with a corresponding SOC die;
   electrically coupling an SOC Core die with a substrate; and electrically coupling each SOC die with the SOC Core die, wherein the plurality of SOC dies are vertically between the SOC Core die and the plurality of PIC dies, and wherein the SOC Core die is vertically between the plurality of SOC dies and the substrate.

13. The method of claim 12, wherein the SOC dies are SOC Core I/O dies; and wherein electrically coupling each SOC with a substrate further includes electrically and physically coupling each SOC Core I/O die with the substrate.

14. The method of claim 12, wherein the SOC dies are SOC I/O dies; and further comprising after electrically and physically coupling each PIC die respectively with each SOC die.

15. A system, comprising:

a multichip package comprising:

a plurality of system on-chip (SOC) dies;

a plurality of photonic integrated circuit (PIC) dies, each PIC die electrically coupled, respectively, with a corresponding SOC die;

an SOC Core die; and a substrate electrically coupled with each of the electrically coupled SOC dies and PIC dies and with the SOC core die, wherein the plurality of SOC dies are vertically between the SOC Core die and the plurality of PIC dies, and wherein the SOC Core die is vertically between the plurality of SOC dies and the substrate; and a printed circuit board (PCB) electrically and/or physically coupled with the multichip package.

16. The system of claim 15, wherein the multichip package is multiple multichip packages.

17. The system of claim 15, further comprising optical fibers coupled with the plurality of PICs.

* * * * *